(12) United States Patent
Voelkel

(10) Patent No.: US 6,504,740 B1
(45) Date of Patent: Jan. 7, 2003

(54) CONTENT ADDRESSABLE MEMORY HAVING COMPARE DATA TRANSITION DETECTOR

(75) Inventor: Eric H. Voelkel, Ben Lomond, CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/904,326

(22) Filed: Jul. 12, 2001

(51) Int. Cl.[7] ............................................. G11C 15/00
(52) U.S. Cl. .................. 365/49; 365/189.07; 365/233.5
(58) Field of Search ............................ 365/4 A, 233.5, 365/202, 189.07

(56) References Cited

U.S. PATENT DOCUMENTS 5,602,795 A * 2/1997 Sandhu ........................ 365/202
6,240,000 B1 * 5/2001 Sywyk et al.

* cited by examiner

Primary Examiner—Huan Hoang
(74) Attorney, Agent, or Firm—Bradley T. Sako

(57) ABSTRACT

A content addressable memory that may have reduced charge consumption when switching compare lines is disclosed. According to one embodiment, a content addressable memory (CAM) (300) with paired compare lines (CMP and CMP\) can include an equalization circuit (320) between the two compare lines (CMP and CMP\). An equalization circuit (320) can enter a low-impedance mode when an equalization control signal (EQU\) is in one state and enter a high-impedance mode when an equalization control signal (EQU\) is in another state. An equalization control signal (EQU\) may be governed by an output pulse of a transition detector (312).

18 Claims, 2 Drawing Sheets

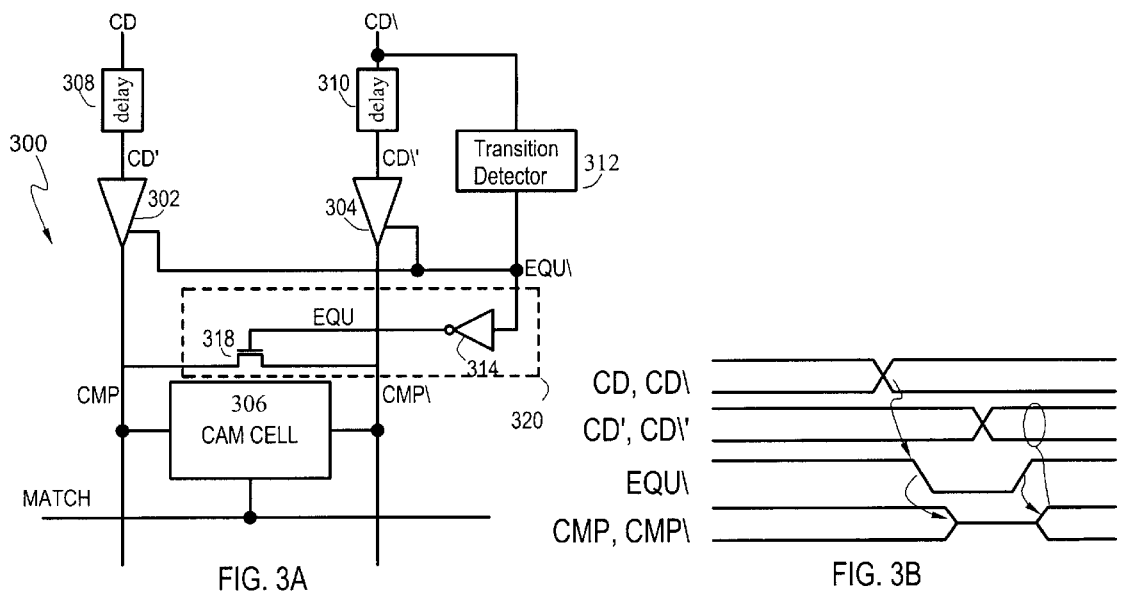
FIG. 3A
FIG. 3B
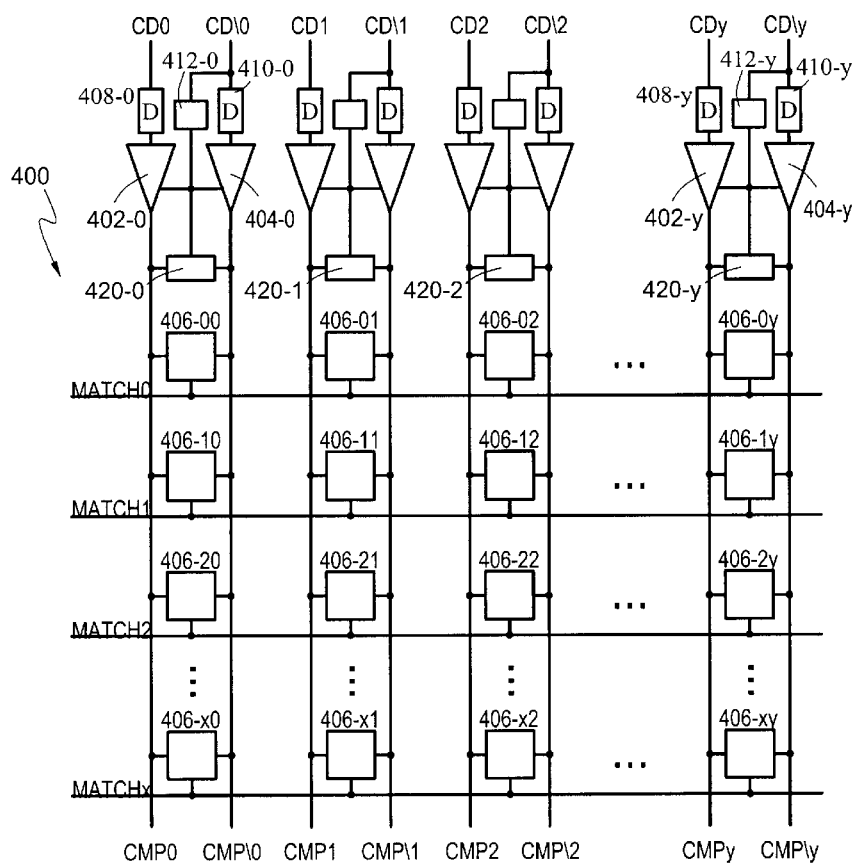
FIG. 4

CONTENT ADDRESSABLE MEMORY HAVING COMPARE DATA TRANSITION DETECTOR

TECHNICAL FIELD

The present invention relates generally to content addressable memories (CAMs) and more particularly to CAMs having binary compare lines.

BACKGROUND OF THE INVENTION

Due to the increasing importance of data networks, including the Internet, the prevalence of content addressable memories (CAMs) has continued to proliferate. CAMs, also referred to as "associative memories," can provide rapid matching functions that are often needed in certain packet processing hardware devices, such as routers and network switches, to name just two. In a typical packet processing operation, a device can receive a packet. The packet can include a "header" having various data fields that indicate how the packet should be processed. A device can use a matching function, provided by a CAM, to compare one or more header fields to "look-up" tables stored in the CAMs.

As just one example, a router can use a matching function to match the destination of an incoming packet with a "forwarding" table. The forwarding table can provide "nexthop" information that can allow the incoming packet to be transmitted to its final destination, or to another node on the way to its final destination.

The look-up tables in packet processing devices (which are typically stored in a CAM) are rarely static. That is, the entries within such a table may be constantly updated with different information. This may be particularly true in routers, which can update forwarding tables thousands of times a second.

A typical CAM can store the data values of a look-up table in one or more CAM cell arrays. CAM cell arrays can be configured into a number of entries, each of which can provide a match indication. In a compare (i.e., match) operation, data values stored within entries can be compared to a comparand value (also referred to as a "search key"). In a typical packet-processing device, a comparand value can include a field extracted from a data packet header. If a data value matches an applied comparand value, a corresponding entry can generate an active match indication. If a data value does not match an applied comparand value, a corresponding entry can generate an inactive match indication (signifying a "mismatch") condition.

The structure of a CAM cell interface is shown in FIG. 1A, designated by the general reference character 100. Referring to FIG. 1A, a binary compare data CD and CD\ are buffered by drivers 102 and 104, respectively. Compare lines, CMP and CMP\, which can be coupled to a CAM cell, may be driven by drivers, 102 and 104. CMP and CMP\ data can be compared to data stored in a CAM cell 106, and a match signal, MATCH, can be generated. Referring to FIG. 1B, waveforms for CD(CD\) and CMP(CMP\) are shown switching to their complementary levels.

An array of CAM cells is illustrated in FIG. 2. A compare word length can have a value 0 to y. A depth of the array, or a number of Match lines, can have a value of 0 to x. Components used in the construction of an array can be multiple placements of those components described in FIG. 1A. Names of the components in FIG. 2 follow the naming used in FIG. 1A, with the first digit "1" being replaced with a "2," and with array designators added as a suffix. Referring to FIG. 2, an array can be comprised of complementary drivers 202-y and 204-y, with y=0 to $y_{max}$. CAM cells are labeled 206-xy, where a given column of cells can be coupled to the same buffered compare lines CMPy and CMP\y and the given row of cells can be coupled to the same match line, MATCHx with x=0 to $X_{max}$.

With the increase in CAM use in various applications has also come the demand for deeper CAMs having an increased number of table entries. Additionally, low-power systems may benefit from chips that have lower operating power. A negative side effect of simply increasing the memory array size can be slower matching speed and/or higher power requirements due to the increased capacitive loading on the CMP and CMP\ lines. Still further, a low-side bus can have higher spike levels because the full capacitive loads on the low-going compare lines can be discharged to the bus. Resulting spikes on the bus can cause problems on those signals sensitive to bus noise, input signals for example. It is thus desirable to reduce the power requirements for larger arrays relative to CAMs constructed with conventional approaches.

SUMMARY OF THE INVENTION

According to disclosed embodiments, a content addressable memory (CAM) may include a scheme to equalize the paired compare lines coupled to the CAM cells.

According to disclosed embodiments, a content addressable memory (CAM) may include equalization circuitry between paired compare lines. An input signal to the equalization circuitry can enable a low-impedance path between compare lines in one state, and can also produce a high-impedance path between compare lines in another state.

According to another aspect of the embodiment, a transition detector can provide equalization circuitry with a pulsed signal responding to a data state change at an input of the detector. This pulsed signal can be used as an input to tri-stateable drivers with outputs coupled to the compare lines.

Further, according to another aspect of the embodiments, transition detector inputs may be coupled to one or more data input signals. These data input signals may also be coupled to delay elements having outputs coupled to tri-stateable drivers.

Another aspect of the embodiment may provide for a memory cell coupled to complementary lines having equalization circuitry there between. A control signal for the equalization circuitry can be coupled to a transition detector. A transition detector can output the control signal after detecting a logic state change on the data input.

An advantage of the disclosed embodiments is that a CAM can reduce power by having the compare lines charge-share prior to driving to the next data state.

BRIEF DESCRIPTION OF THE DRAWINGS

FIG. 3A is a schematic diagram of a first embodiment.

FIG. 3B is a timing diagram of a first embodiment.

FIG. 4 is a diagram of an embodiment having a CAM cell array according to an embodiment.

DETAILED DESCRIPTION OF THE EMBODIMENTS

Figure 1A:
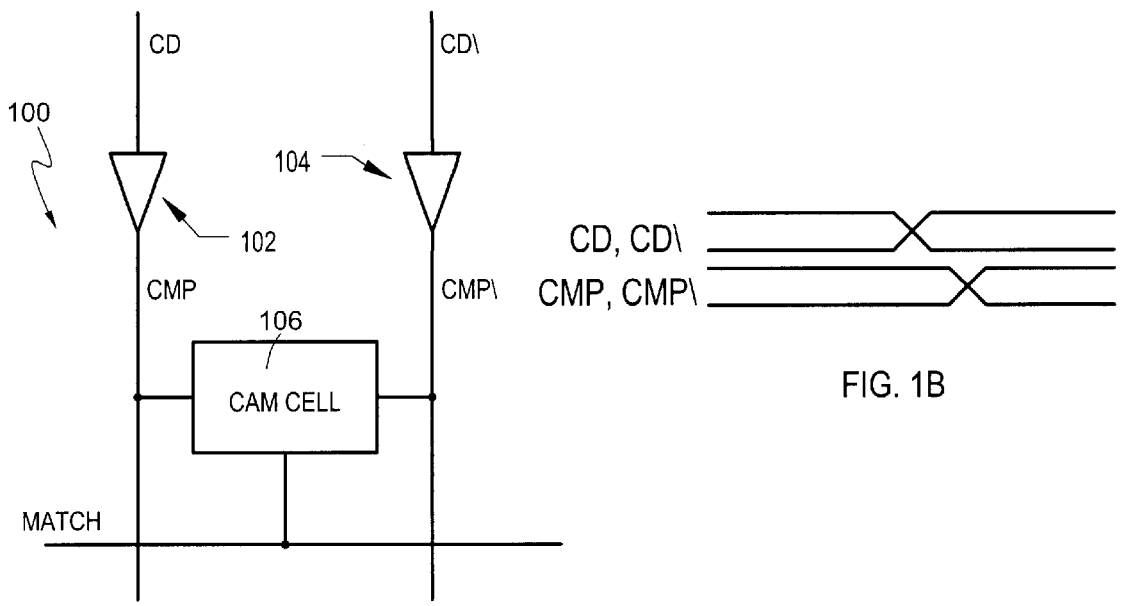
FIG. 1A is a schematic diagram of a content addressable memory (CAM) cell interface.
Figure 1B:
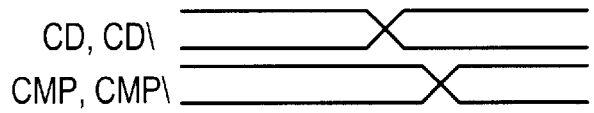
FIG. 1B is a timing diagram of the compare lines as seen in FIG. 1A.
Figure 2:
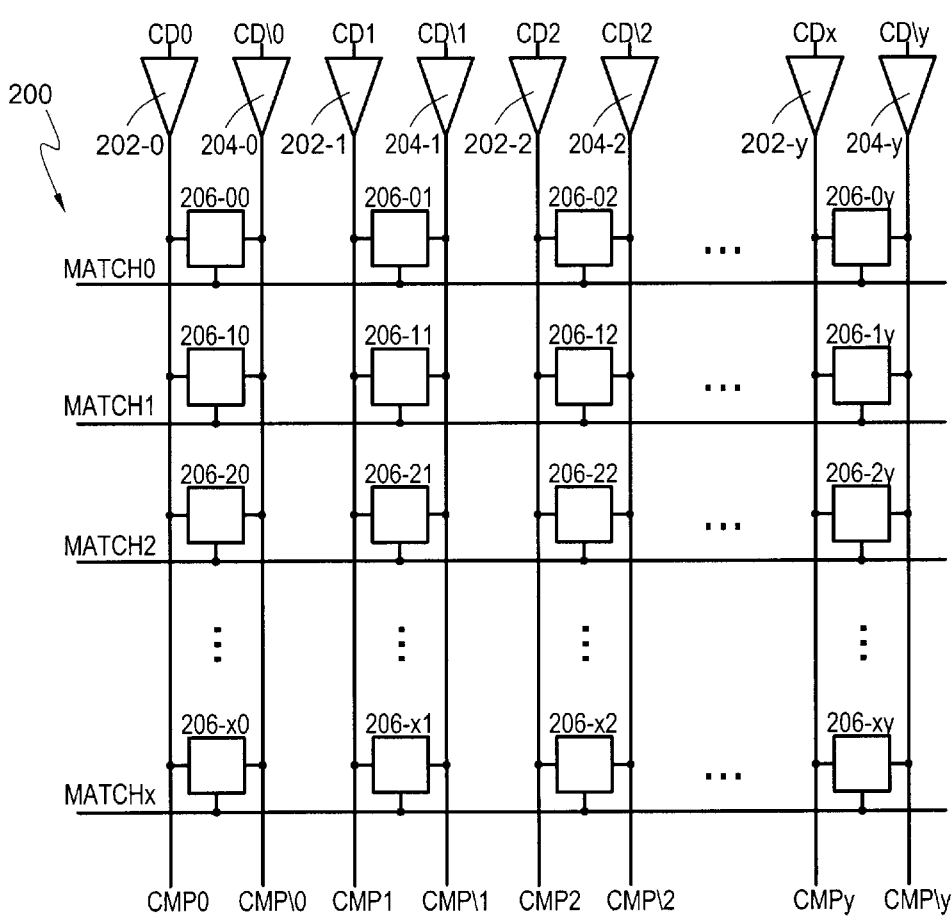
FIG. 2 is a schematic diagram of a CAM cell array.

According to various embodiments of the present invention, a content addressable memory (CAM) can have reduced power consumption by charge-sharing compare lines that driven to opposite states through equalization, for example. From an equalized level, complementary lines (CMP and CMP) can be driven to their respective opposite levels.

Referring now to FIG. 3A, a first embodiment of a CAM is set forth in a diagram and designated by the general reference character 300. A first embodiment 300 may include a CAM cell 306 coupled to the compare lines, CMP and CMP, and a match line, MATCH. Equalization circuitry 320 may be coupled between compare lines, CMP and CMP\. Equalization circuitry 320 may include a device that provides a controllable impedance path between compare lines. In the example of FIG. 3, equalization circuitry may include an n-channel transistor 318 and an inverter 314.

A first embodiment 300 may also include tri-stateable drivers, 302 and 304, that can drive data on compare lines, CMP and CMP. Further, a transition detector 312 may be added to generate a control signal used to control the equalization circuitry 320 and/or tri-stateable drivers 302 and 304.

Comparand data (CD\ and/or CD) may be used as inputs to a transition detector 312. An output line of a transition detector 312, EQU\, may enable and disable tri-stateable drivers (302 and 304). An EQU\ signal can also be used to equalize compare lines (CMP and CMP\) via equalization circuitry 320. Delay elements 308 and 310 may be placed in the data path from comparand data (CD and CD\), respectively, to their corresponding drivers, 302 and 304. As will be described shortly, delays introduced by delay elements (308 and 310) can prevent new data from being driven prior to a disabling of tri-stateable drivers (302 and 304).

Referring now to FIG. 3B, a functional timing diagram is set forth illustrating the operation of the embodiment 300 of FIG. 3A. The timing diagram of FIG. 3A illustrates complementary comparand data values, CD and CD\, complementary comparand data values as delayed by delay elements, CD' and CD\', a transition detect output value EQU\, and compare line values CMP and CMP\.

A signal EQU\ may pulse low when a comparand signal CD\ transition is detected. An EQU\ signal low-going pulse may tri-state drivers 302 and 304, and may enable an equalization transistor 318 after inversion. Once enabled, equalization circuitry 320 may allow compare lines CMP and CMP\ to charge-share. This is in contrast to conventional approaches that may discharge both compare lines to a low power supply level.

Referring once again to FIG. 3, signals CD and CD\ may be delayed through delay elements (308 and 310), resulting in signals CD' and CD\'. Such a delay may help to ensure that tri-stateable drivers (302 and 304) are tri-stated as new compare data (CD and CD\) is received, and while compare lines (CMP and CMP\) are equalized.

Following a charge-sharing on compare lines (CMP and CMP\), a high-going EQU\ signal may enable tri-stateable drivers (302 and 304) and may disable the equalization circuitry 320. By bringing compare lines CMP and CMP\ to a charge-shared level prior to receiving new compare data (CD and CD\), the charge needed to drive a high-going compare line can be reduced (by half where equalization is to a half-supply level). Similarly, the amount of discharge discharged on a low-going compare line may also be reduced.

An example of an array construction using structures such as those shown in FIG. 3A is set forth in FIG. 4. Referring to FIG. 4, the naming convention follows that of FIG. 3A with the first digit, "3", replaced with a "4" and with array designators added as a suffix.

An array 400 may include complementary tri-stateable drivers, 402-y and 404-y (with y=0 to $y_{max}$), that may be coupled to compare lines CMPy and CMP\y. CAM cells are labeled 406-xy, where a given column of cells may be coupled to the same buffered compare lines (CMPy and CMP\y) and a given row of cells may be coupled to the same match line, MATCH$_x$, with x=0 to $x_{max}$. Equalization circuitry, 420-y, may also be coupled to CMPy and CMP\y lines.

Transition detectors 412-y may be used to control tri-stateable drivers, (402-y and 404-y) and/or equalization circuitry 420-y. Such transition detectors can use data inputs CD\y as a signals that is checked to determine if a state change takes place. Tri-stateable drivers (402-y and 404-y) may have inputs delayed by delay elements (408-x and 410-x).

In this way charge sharing may be implemented on an array wide basis, conserving charge for multiple compare lines.

It is noted that while some examples have noted that charging sharing may result in compare line potential that are the same, and may be essentially ½ a supply voltage (or full logic high value), this should not be construed as limiting the invention thereto. An outcome of an equalization operation may result in intermediate charge-shared levels where the compare lines are not truly equal. As but one example, a shorter equalization operation may not truly equalize potential.

It is also noted that while the disclosed embodiments utilize a compare data value CD\ to determine when a transition occurs, a compare data transition detector may use a complementary value CD, or both compare data values (CD and CD\) to determine when a transition occurs, to name but a few examples.

Still further, while delay elements 308 and 310 are illustrated as separate entities in FIGS. 3A and 4, such delay elements may be integrated into the tri-state drivers, 302 and 304 as but one variation.

Still further, it is understood that equalization circuitry (be it singular or multiple circuits distributed along the compare lines (CMP and CMP\)) may take a variety of forms including, but not limited to, an n-channel transistor, a p-channel transistor or a complementary metal oxide semiconductor (CMOS) passgate.

Additionally, the polarity of a transition detector output may be inverted relative to what has been discussed with polarity changes made to those circuits coupled to the transition output signal, as one skilled in the art would comprehend.

Along these same lines, with respect to an array according to the present invention, a transition detector may be coupled to more than one data input, such that the resulting transition detector output pulse controls more than one compare data line pair.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising:
   a CAM memory cell coupled to a first compare line and a second compare line;
   an equalization circuitry coupled to the first and second compare lines that provides a low impedance path between the first and second compare lines when an equalization control signal received at an equalization input is at a first logic level and provides a high impedance path between the first and second compare lines when the equalization control signal is at a second logic level;
   a transition detector having a transition detector input and generating a transition output pulse at the fist logic level when there are logical changes at the transition detector input; and
   the equalization input is coupled to the transition output pulse.

2. The CAM of claim 1, wherein:
   the equalization circuitry includes an n-channel transistor.

3. The CAM of claim 1, wherein:
   the equalization circuitry includes a p-channel transistor.

4. The CAM of claim 1, wherein:
   the equalization circuitry includes a CMOS passgate.

5. The CAM of claim 1, further including:
   a plurality of CAM memory cells arranged into at least one column that is coupled to the first and second compare data lines.

6. The CAM of claim 1, further including:
   a first tri-stateable driver having a first tri-stateable input and having an output coupled to the first compare line, the first tri-stateable driver coupled to receive the transition output pulse; and
   a second tri-stateable driver having a second tri-stateable input and having an output coupled to the second compare line, the second tri-stateable driver coupled to receive the transition output pulse.

7. The CAM of claim 6, further including:
   a first delay element having an input coupled to receive a first data input signal and a first delay output coupled to the first tri-stateable input; and
   a second delay element having an input coupled to receive a second data input signal and a second delay output coupled to the second tri-stateable input; and the transition detector input is coupled to the first data input signal.

8. The CAM of claim 6, further including;
   a first delay element having an input coupled to receive a first data input signal and having a first delay output coupled to at least the first tri-stateable input.

9. The CAM of claim 8, wherein:
   the transition detector input is coupled to the first data input signal.

10. A content addressable memory (CAM), comprising:
    a CAM memory cell coupled to a first and second compare line;
    a transition detector receiving an input signal at a transition detector input and generating a transition output pulse when there are logical changes in the input signal;
    a first tri-stateable driver having a first driver input and having an output coupled to the first compare line that enters a high impedance state in response to the transition output pulse; and
    a second tri-stateable driver having a second driver input and having an output coupled to the second compare line that enters a high impedance state in response to the transition output pulse.

11. The CAM of claim 10, further including:
    a first delay element having an input coupled to receive a first data input signal and an output coupled to the first driver input; and
    the first data input signal coupled to the second driver input.

12. The CAM of claim 10, wherein.
    the transition detector receives the first data input signal as the input signal.

13. The CAM of claim 10, further including;
    a first delay element having an input coupled to receive a first data input signal and a first delay output coupled to the first driver input; and
    a second delay element having an input coupled to receive a second data input signal and a second delay output coupled to the second driver input; and
    the transition detector input is coupled to the first data input signal.

14. A memory, comprising:
    a memory cell coupled to a first data line and a second data line;
    an equalization circuit coupled to the first and second data lines that receives at least one equalization control signal at an equalization input, the equalization circuit providing a low impedance path between the first and second data lines when the equalization control signal is at a first logic level and provides a high impedance path between the first and second data lines when the equalization control signal is at a second logic level; and
    a transition detector that receives a first data signal and generates a transition output signal of the first logic level when there are logical changes in the first data signal, the transition output signal being coupled to the equalization input.

15. The memory of claim 14, further including:
    a memory column comprising a plurality of memory cells that is coupled to the first and second data lines.

16. The memory of claim 14, further including:
    a first tri-stateable driver having a first driver input coupled to receive the first data signal and a first driver output coupled to the first data line, the first tri-stateable driver coupled to receive the transition output pulse; and
    a second tri-stateable driver having a second driver input and a second driver output coupled to the second data line, the second tri-stateable driver coupled to receive the transition output pulse.

17. The memory of claim 16, further including:
    a first delay element that couples the first data input to the first and second driver inputs.

18. The memory of claim 17, further including:
    a first delay element coupling the first data input to the first driver input; and
    a second delay element coupling a second data input to the second driver input.

* * * * *

UNITED STATES PATENT AND TRADEMARK OFFICE
CERTIFICATE OF CORRECTION

PATENT NO. : 6,504,740 B1
APPLICATION NO. : 09/904326
DATED : January 7, 2003
INVENTOR(S) : Eric H. Voelkel It is certified that error appears in the above-identified patent and that said Letters Patent is hereby corrected as shown below:

IN THE SPECIFICATION

At column 2, line 7, please replace "$X_{max}$" with -- $x_{max}$ -- so that the corresponding phrase reads -- $x=0$ to $x_{max}$ --.

At column 3, line 22, please replace the second "CMP" with -- CMP\ -- so that the corresponding phrase reads -- CMP and CMP\ --.

Signed and Sealed this

Twenty-seventh Day of May, 2008

JON W. DUDAS
*Director of the United States Patent and Trademark Office*